United States Patent
Lim et al.

(10) Patent No.: US 7,330,554 B2
(45) Date of Patent: Feb. 12, 2008

(54) VOLUME CONTROL APPARATUS AND METHOD THEREOF

(75) Inventors: Hyun-sig Lim, Seoul (KR); Eun-young Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 769 days.

(21) Appl. No.: 10/602,002

(22) Filed: Jun. 24, 2003

(65) Prior Publication Data

US 2004/0052385 A1    Mar. 18, 2004

(30) Foreign Application Priority Data

Aug. 13, 2002   (KR)   .................. 10-2002-0047899

(51) Int. Cl.
*H03G 3/00* (2006.01)
*H03G 7/00* (2006.01)
*H03G 9/00* (2006.01)

(52) U.S. Cl. .................. 381/104; 381/107; 381/109; 381/102; 381/106

(58) Field of Classification Search ............ 381/104, 381/107, 109, 102, 106
See application file for complete search history.

(56) References Cited

U.S. PATENT DOCUMENTS

| | | | | |
|---|---|---|---|---|
| 4,239,938 A | * | 12/1980 | Ponto ........................ | 381/104 |
| 4,349,779 A | * | 9/1982 | Ono ........................... | 323/318 |
| 4,412,182 A | * | 10/1983 | Yochum ..................... | 330/59 |
| 4,527,230 A | * | 7/1985 | Sato et al. .................. | 700/1 |
| 4,611,344 A | * | 9/1986 | Hayama et al. ............ | 381/108 |

(Continued)

FOREIGN PATENT DOCUMENTS

CN    1189046    7/1998

(Continued)

OTHER PUBLICATIONS

Korean Office Action dated Oct. 28, 2004 issued in corresponding Korean Patent Application No. 10-2002-0047899.

(Continued)

*Primary Examiner*—Vivian Chin
*Assistant Examiner*—Devona E Faulk
(74) *Attorney, Agent, or Firm*—Staas & Halsey LLP (57) ABSTRACT

A volume control apparatus and a method enable the volume of sound output from a sound output system to be adjusted in units of an increase/decrease interval set by a user, the volume control apparatus controlling the volume of sound output from the sound output system on a basis of volume level information set by the user. The volume control apparatus includes a memory in which sound increase/decrease interval information which a user wants is stored, a command and information input unit that inputs the sound increase/decrease interval information and a volume control signal with respect to sound output from the sound output system, a sound output unit that outputs sound generated in the sound output system to an outside of the volume control apparatus, and a system control unit that stores the sound increase/decrease interval information input from the command and information input unit in the memory and controls the sound output unit such that sound output from the sound output unit is increased/decreased a basis of the sound increase/decrease interval information stored in the memory when the volume control signal is received.

22 Claims, 4 Drawing Sheets

U.S. PATENT DOCUMENTS

| | | | | |
|---|---|---|---|---|
| 4,706,294 A | * | 11/1987 | Ouchida | 381/109 |
| 5,010,577 A | * | 4/1991 | Sakanishi et al. | 381/104 |
| 5,081,682 A | * | 1/1992 | Kato et al. | 381/57 |
| 5,150,404 A | * | 9/1992 | Jordan | 379/155 |
| 5,513,268 A | * | 4/1996 | Bironas et al. | 381/109 |
| 6,167,139 A | | 12/2000 | Kim | |
| 6,747,678 B1 | * | 6/2004 | Katayama et al. | 381/109 |
| 6,760,635 B1 | * | 7/2004 | Bates et al. | 700/94 |
| 2002/0031236 A1 | * | 3/2002 | Shimizu et al. | 381/104 |

FOREIGN PATENT DOCUMENTS

| | | |
|---|---|---|
| JP | 2001-028524 | 1/2001 |
| KR | 10-2002-0008367 | 1/2002 |

OTHER PUBLICATIONS

Chinese Office Action dated Aug. 5, 2005, corresponds to Chinese Patent Application No. 03127751.9.

* cited by examiner

VOLUME CONTROL APPARATUS AND METHOD THEREOF

CROSS-REFERENCE TO RELATED APPLICATIONS

This application claims the priority of Korean Patent Application No. 2002-47899, filed on Aug. 13, 2002, in the Korean Intellectual Property Office, the disclosure of which is incorporated herein by reference.

BACKGROUND OF THE INVENTION

1. Field of the Invention

The present invention relates to a sound output system, and more particularly, to an apparatus for controlling the volume of output sound and a method thereof.

2. Description of the Related Art

Figure 1:
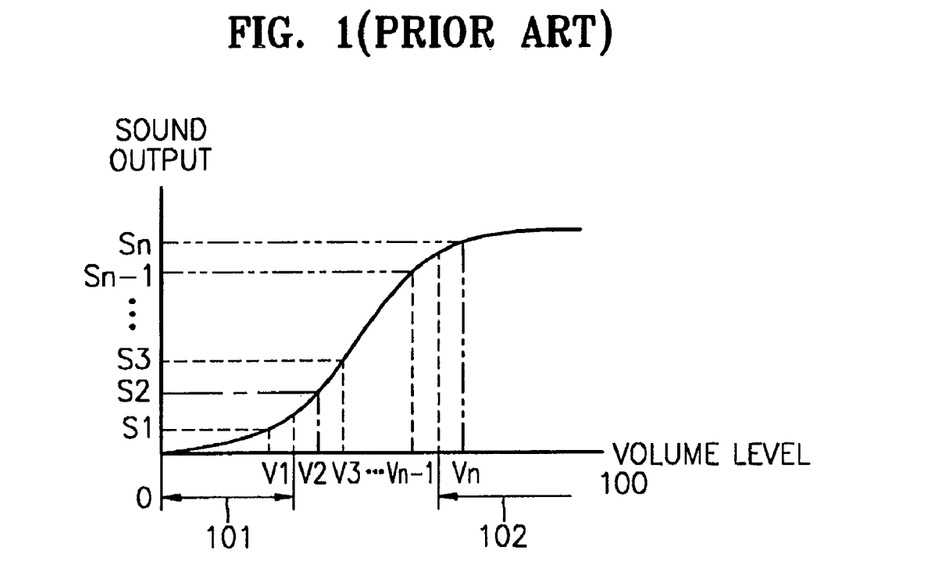
FIG. 1 illustrates a relationship between a sound output and a volume level in a conventional sound output system.

The general characteristics of sound output from a sound output system are shown in FIG. 1. Users are not sensitive to variation in sound output within intervals (101) and (102) of FIG. 1. In this regard, a conventional sound output system is designed, taking into account the relation between volume level and sound output so that sound output varies linearly with volume control, as shown in FIG. 1.

That is, in FIG. 1, an interval between S1 and S2, an interval between S2 and S3, and an interval between Sn-1 and Sn are the same. If a user increases a volume level from V1 to V2, the sound output level increases from S1 to S2, and if the user decreases the volume level from V3 to V2, the sound output level decreases from S3 to S2.

Since conventional sound output systems output sound on the basis of a relationship between a volume level and a sound output that is determined in advance, conventional sound output systems cannot satisfy the desires for precise volume control of users such as music experts who are sensitive to minor variations in sound output.

SUMMARY OF THE INVENTION

The present invention provides a volume control apparatus which enables the volume of sound output from a sound output system to be adjusted in units of an increase/decrease interval set by a user, and a method thereof.

The present invention also provides an apparatus to control the volume of sound output from a sound output system on the basis of volume level information set by a user, and a method thereof.

According to one aspect of the present invention, a volume control apparatus controls the volume of sound output from a sound output system. The apparatus includes a memory in which sound increase/decrease interval information which a user wants is stored, a command and information input unit which inputs the sound increase/decrease interval information and a volume control signal with respect to sound output from the sound output system, a sound output unit which outputs sound generated in the sound output system to the outside, and a system control unit which stores the sound increase/decrease interval information input from the command and information input unit in the memory and controls the sound output unit such that sound output from the sound output unit is increased/decreased on the basis of the sound increase/decrease interval information stored in the memory whenever the volume control signal is received.

If the sound increase/decrease interval information is input from the command and information input unit, the system control unit may store the sound increase/decrease interval information in the memory when the sound increase/decrease interval is greater than a minimum increase/decrease interval set in the sound output system and less than a maximum increase/decrease interval set in the sound output system.

The sound increase/decrease interval information may be set to be applied to part of an interval of sound which can be output from the sound output system.

According to another aspect of the present invention, a volume control method of a sound output system comprises storing sound increase/decrease interval information which a user wants, and controlling sound output from the sound output system to increase/decrease on the basis of the sound increase/decrease interval whenever a volume control signal is received.

In the operation of storing, the sound increase/decrease interval information may be set to be applied to a part of an interval of sound which can be output from the sound output system.

According to still another aspect of the present invention, a volume control apparatus of a sound output system includes a memory, a command and information input unit, a sound output unit, and a system control unit. The volume level information selected by a user is sequentially stored in the memory in an order selected by the user. The command and information input unit inputs volume level information selected by the user and a volume control signal with respect to sound output from the sound output system. The sound output unit outputs sound generated in the sound output system to the outside of the apparatus. The system control unit sequentially stores the volume level information input from the command and information input unit in the memory and controls the sound output unit such that sound output from the sound output unit is increased/decreased on the basis of the order of the volume level information stored in the memory whenever the volume control signal is received.

The number of volume levels that can be stored in the memory is less than the maximum number of volume levels that can be set by the user in the sound output system. The value of the volume level stored in the memory is random.

According to another aspect of the present invention, a volume control method of a sound output system comprises, if a user selects a volume level, comparing the number of volume levels currently set by the user with the maximum number of volume levels that can be set by the user in the sound output system, and if the number of volume levels set by the user is smaller than the maximum number of volume levels, storing a volume level selected by the user and increasing the number of volume levels set by the user by one.

The method may further comprise controlling a volume level of sound output from the sound output system on the basis of the order in which volume levels selected by the user are stored whenever the user inputs a volume control signal. The volume level corresponds to sound that the user wants, between minimum sound and maximum sound that can be output from the sound output system, regardless of the previously selected volume level.

BRIEF DESCRIPTION OF THE DRAWINGS

The above and/or other aspects and advantages of the present invention will become more apparent by describing in detail preferred embodiments thereof with reference to the attached drawings in which.

DETAILED DESCRIPTION OF THE PREFERRED EMBODIMENTS

Hereinafter, embodiments of the present invention will be described in detail with reference to the accompanying drawings.

Figure 2:
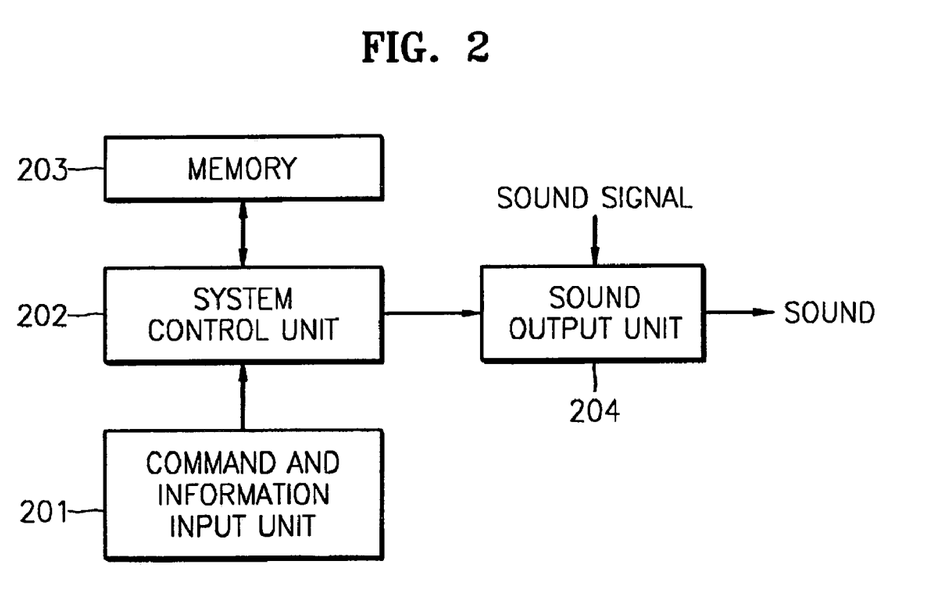
FIG. 2 is a block diagram illustrating an embodiment of a volume control apparatus according to the present invention.

FIG. 2 is a block diagram illustrating an embodiment of a volume control apparatus according to the present invention. Referring to FIG. 2, the volume control apparatus includes a command and information input unit 201, a system control unit 202, a memory 203, and a sound output unit 204.

The command and information input unit 201 inputs sound increase/decrease interval information which a user wants, or volume level information which the user selects, and a volume control signal generated using a volume control key (+/−).

If sound increase/decrease interval information is input from the command and information input unit 201, the system control unit 202 determines whether to receive the currently input sound increase/decrease interval information using minimum sound increase/decrease interval information MIN INTERVAL and maximum sound increase/decrease interval information MAX INTERVAL, which are preset. The minimum sound increase/decrease interval information MIN INTERVAL and the maximum sound increase/decrease interval information MAX INTERVAL are condition information that can be received by elements of a sound output system.

If the sound increase/decrease interval information is input from the command and information input unit 201, the system control unit 202 determines whether the input sound increase/decrease interval information satisfies the conditions of being greater than the minimum sound increase/decrease interval information MIN INTERVAL and less than the maximum sound increase/decrease interval information MAX INTERVAL. If the input sound increase/decrease interval information satisfies these conditions, the system control unit 202 stores the currently input sound increase/decrease interval information in the memory 203.

Thereafter, if the sound increase/decrease interval information is stored in the memory 203 and the volume control key (+/−) placed in the command and information input unit 201 is utilized, the system control unit 202 controls an increase/decrease of the sound output from the sound output unit 204 on the basis of the sound increase/decrease interval information stored in the memory 203. That is, if the volume control key (+) is pressed, the system control unit 202 controls the sound output unit 204 such that the output sound is increased in units of the sound increase/decrease interval. Likewise, if the volume control key (−) is pressed, the system control unit 202 controls the sound output unit 204 such that the output sound is decreased in units of the sound increase/decrease interval.

Figure 3:
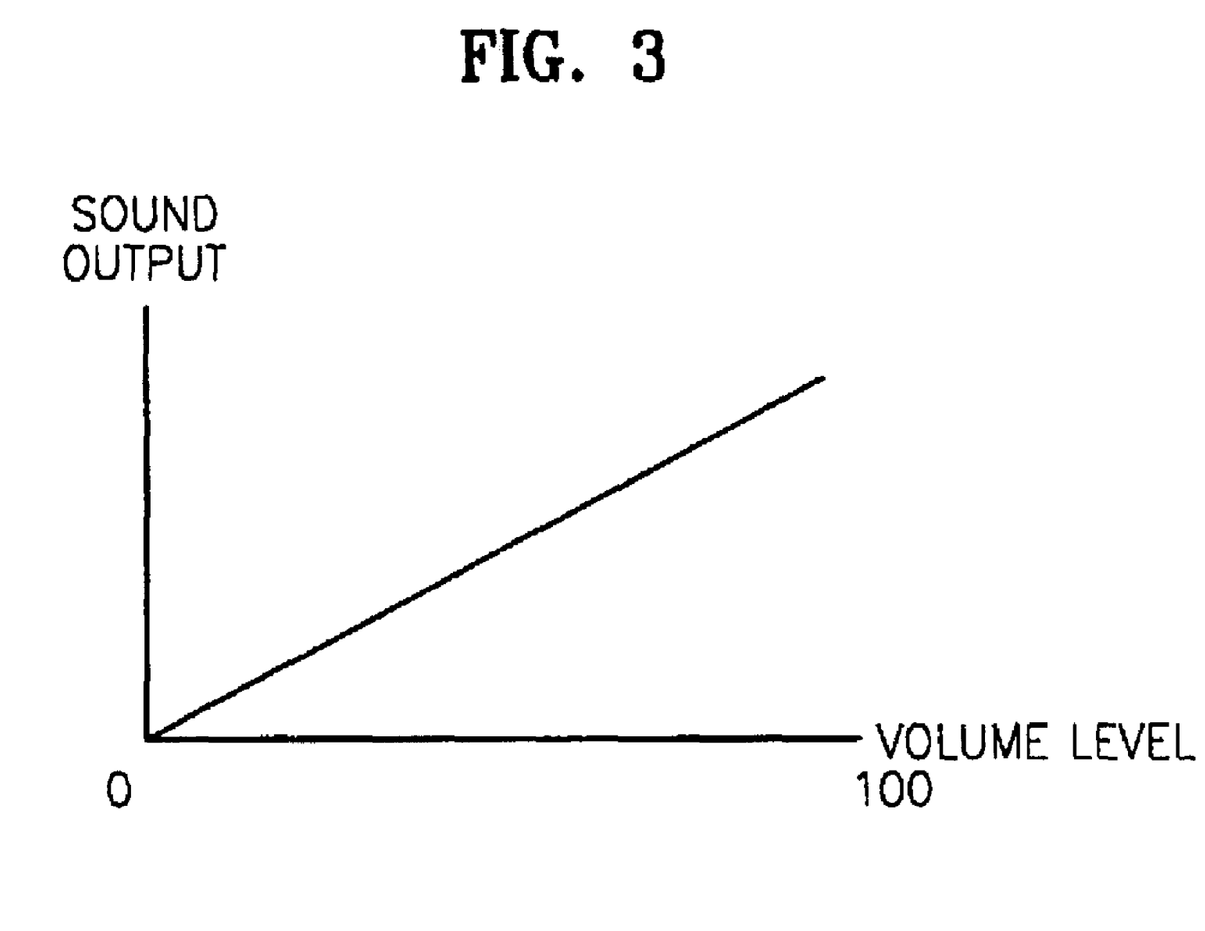
FIG. 3 illustrates the characteristics of sound controlled by the volume control apparatus according to an embodiment of the present invention.

As a result, the sound output from the sound output unit 204 can be varied linearly with respect to the volume level, as shown in FIG. 3. The sound output unit 204 outputs sound generated in the sound output system to the outside of the volume control apparatus.

To obtain the linear characteristics shown in FIG. 3, the system control unit 202 applies the sound increase/decrease interval information stored in the memory 203, at a specific interval (i.e., interval (101) or (102) of FIG. 1) at which the sound output varies nonlinearly with respect to the volume level. Also, the system control unit 202 applies a sound increase/decrease interval, set by default in the sound output system, at an interval in which sound output varies linearly with respect to volume level. Information on the interval at which the sound increase/decrease interval information stored in the memory 203 is applied can be preset in the system control unit 202, or the user can input the information using the command and information input unit 201.

If the user inputs the information on the applied interval using the command and information input unit 201, the system control unit 202 can store the information on the applied interval in the memory 203. Thus, if the command and information input unit 201 receives the volume control signal ((+/−) key signal), the system control unit 202 determines whether a volume control interval corresponds to the specific interval, and if so, the system control unit 202 controls the sound output unit 204 on the basis of the sound increase/decrease interval stored in the memory 203. However, if it is determined that the volume control interval is an interval other than the specific interval, the system control unit 202 controls the sound output unit 204 on the basis of the sound increase/decrease interval set by default. The sound increase/decrease interval information set by default may be stored in the memory 203 or in the system control unit 202.

Also, the sound increase/decrease interval information stored in the memory 203 can be applied to all intervals of sound that can be output from the sound output system.

Meanwhile, the volume control apparatus of FIG. 2 may control volume of output sound on the basis of volume level information which the user selects by using the command and information input unit 201. That is, if the user inputs desired volume level information using the command and information input unit 201, the system control unit 202 checks whether the number of currently set volume levels selected by the user is smaller than the number of volume levels that can be set by the user (where the number of volume levels is preset). The number of volume levels which can be set by the user is the number of volume levels that can be adjusted by the sound output system.

As a result of checking, if the number of volume levels selected by the user is smaller than the number of volume levels that can be set by the user, the system control unit 202 stores currently selected volume level information in the memory 230. In this case, the input volume level information has no relation with the previously input volume level information. For example, when the number of volume levels that can be set by the user in the sound output system is 100, the previously input volume level may be 50, and the currently input volume level may be 3. Since the memory 230 sequentially stores the input volume level information, in the above-mentioned case, a volume level 3 is stored immediately after a volume level 50.

In the above manner, the number of volume levels that can be set by the user can be stored in the memory 203. For example, if the number of volume levels that can be set by the user set in the system control unit 202 is N, volume level information corresponding to the N volume levels can be stored in the memory 203. N cannot exceed 100 if the maximum number of volume levels of the sound output system is 100.

In this way, if volume level information corresponding to a plurality of volume levels is stored in the memory 203, and the volume control key (+/−) provided in the command and information input unit 201 is utilized, the system control unit 202 controls the sound output unit 204 on the basis of volume level information stored in the memory 203.

For example, if a volume level is stored in the memory 203 in the order of "2, 50, 30, 23, 3, 65, 78, 40, 21, and 33, the volume level is controlled in the order of 2->50->30->23->3->65->78->40->21->33->2 whenever the volume control key (+) is pressed, and thus the sound output unit 204 outputs sound which corresponds to the volume level. Thus, the user can hear sound having a rapidly-varied volume.

In contrast, if the volume control key (−) is pressed, the volume level is controlled in an order which is the reverse of the above order. The system control unit 202 controls the sound output unit 204 such that if the volume control key (−) is pressed at a '3' volume level, sound corresponding to a 23 volume level is output, and if the volume control key (+) is pressed at the '3' volume level, sound corresponding to a 65 volume level is output. As such, the value of the volume level stored in the memory 203 may be regularly or randomly set as described above.

Figure 4:
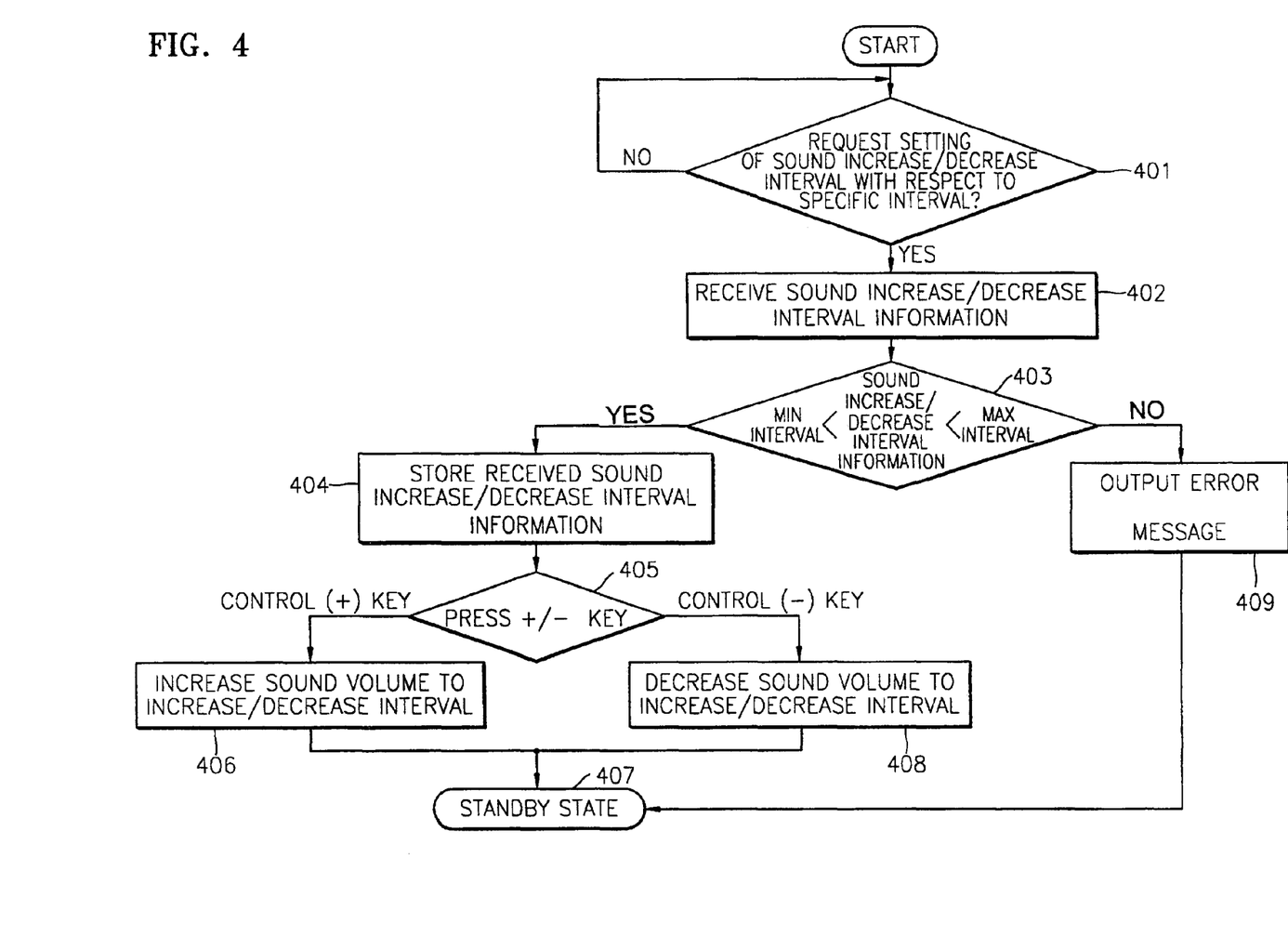
FIG. 4 is a flow chart illustrating an embodiment of a volume control method according to the present invention.

FIG. 4 is a flow chart illustrating a volume control method according to an embodiment of the present invention.

In operation 401, if setting of a sound increase/decrease interval with respect to a specific interval is needed, in operation 402, the system control unit 202 receives sound increase/decrease interval information. In operation 403, it is determined whether the received sound increase/decrease interval information satisfies the conditions of being greater than a minimum sound increase/decrease interval MIN INTERVAL and less than a maximum sound increase/decrease interval MAX INTERVAL.

If the received sound increase/decrease interval information satisfies the above conditions, in operation 404, the system control unit 202 stores the received sound increase/decrease interval information in the memory 203. If it is determined in operation 405 that a volume control key (+) is pressed, in operation 406, the system control unit 202 adjusts the volume of output sound to be increased to the stored sound increase/decrease interval. Then, in operation 407, a standby state is set.

If it is determined in operation 405 that a volume control key (−) is pressed, in operation 408, the system control unit 202 adjusts the volume of output sound to decrease to the stored sound increase/decrease interval. Then, the method returns to operation 407, and the standby state is set.

If the received sound increase/decrease interval information does not satisfy the above conditions in operation 403, in operation 409, the system control unit 202 outputs an error message, and then, in operation 407, the standby state is set. The error message may be output to the sound output unit 204 or may be output to a display (not shown).

Figure 5:
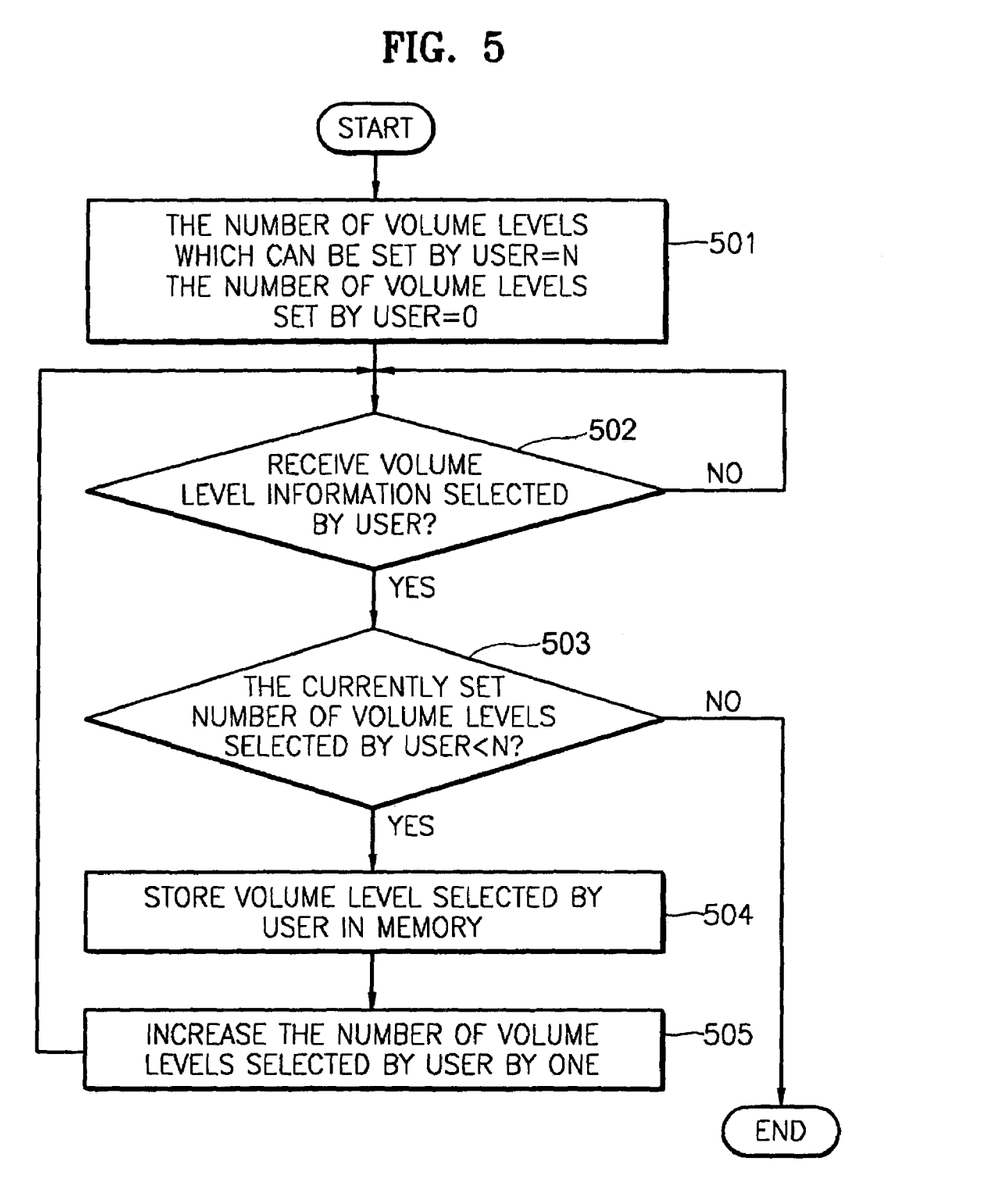
FIG. 5 is a flow chart illustrating a process of collecting information to control volume according to another embodiment of the volume control method.

FIG. 5 is a flow chart illustrating a process of collecting information for controlling volume according to another embodiment of the volume control method. In operation 501, the number of volume levels that can be set by the user is set to N, and the number of volume levels set by the user is set to 0. In this state, in operation 502, the system control unit 202 determines whether volume level information selected by the user is received. The volume level information selected by the user is input through the command and information input unit 201.

If it is determined in operation 502 that the volume level information selected by the. user is received, in operation 503, it is determined whether the currently set number of volume levels selected by the user is smaller than N. The volume level information received in operation 502 is a volume level corresponding to sound which the user wants, between maximum sound and minimum sound output from the sound output system.

If it is determined in operation 503 that the currently set number of volume levels selected by the user is smaller than N, in operation 504, the system control unit 202 stores the volume level information selected by the user in the memory 203. Then, in operation 505, the system control unit 202 increases the number of volume levels selected by the user by one, and the process returns to operation 502.

If it is determined in operation 502 that no volume level information is received from the user, the process returns to operation 502, and the system control unit 202 rechecks the receiving state of volume level information.

If it is determined in operation 503 that the currently set number of volume levels selected by the user is not smaller than N, the system control unit 202 does not receive any further volume level information and terminates the process.

In this way, whenever the volume level information corresponding to the plurality of volume levels is stored in the memory 203 and the volume control key (±) is pressed, the system control unit 202 controls the volume of sound output in the order of the volume level information stored in the memory 203, as described in detail with reference to FIG. 2.

As described above, in the volume control apparatus and method thereof, the volume of sound output at the sound increase/decrease interval set by the user is controlled with the increase/decrease key ((+/−) key) for controlling volume, thus improving the degree of control the user has over the volume, and further providing a closer linear relationship between output sound volume and volume control.

In addition, the volume level of sound to be output may be randomly set by the user within the range between the minimum sound volume and maximum sound volume that can be provided by the sound output system, thus controlling the volume level in various ways.

While is invention has been particularly shown and described with reference to preferred embodiments thereof, it will be understood by those skilled in the art that various changes in form and details may be made therein without departing from the spirit and scope of the invention as defined by the appended claims and equivalents thereof.

What is claimed is:

1. A volume control apparatus of a sound output system, the apparatus comprising:
   a memory in which sound increase/decrease interval information that a user inputs is stored;
   a command and information input unit that inputs the sound increase/decrease interval information and a volume control signal with respect to sound output from the sound output system;
   a sound output unit that outputs sound generated in the sound output system to an outside of the sound output system; and
   a system control unit that stores the sound increase/decrease interval information input from the command and information input unit in the memory and controls the sound output unit such that sound output from the sound output unit is increased/decreased on a basis of the sound increase/decrease interval information stored in the memory when the volume control signal is received, wherein if the sound increase/decrease interval information is input from the command and information input unit, the system control unit stores the sound increase/decrease interval information in the memory when the sound increase/decrease interval is greater than a minimum increase/decrease interval set in the sound output system and less than a maximum increase/decrease interval set in the sound output system.

2. The apparatus of claim 1, wherein the sound increase/decrease interval information is applied to part of an interval of sound that is output from the sound output system.

3. A volume control method of a sound output system, the method comprising:

storing sound increase/decrease interval information that a user wants; and controlling sound output from the sound output system to increase/decrease sound output on a basis of the sound increase/decrease interval information when a volume control signal is received, wherein the storing comprises storing the sound increase/decrease interval information in the memory when the sound increase/decrease interval is greater than a minimum increase/decrease interval set in the sound output system and less than a maximum increase/decrease interval set in the sound output system.

4. The method of claim 3, wherein the storing comprises applying the sound increase/decrease interval information to a selected interval of sound that is output from the sound output system.

5. A volume control apparatus of a sound output system, the apparatus comprising:

a memory in which volume levels selected by a user are sequentially stored in an order selected by the user;

a command and information input unit that inputs the volume levels selected by the user and a volume control signal with respect to sound output from the sound output system;

a sound output unit that outputs sound generated in the sound output system to an outside of the sound output system; and a system control unit that sequentially stores the volume levels input from the command and information input unit in the memory and controls the sound output unit such that sound output from the sound output unit is increased/decreased on a basis of the order of the volume levels stored in the memory when the volume control signal is received, wherein, when a sound increase/decrease interval information is input from the command and information input unit, the system control unit stores the sound increase/decrease interval information in the memory when the sound increase/decrease interval is greater than a minimum increase/decrease interval set in the sound output system and less than a maximum increase/decrease interval set in the sound output system.

6. The apparatus of claim 5, wherein a number of the volume levels storable in the memory is less than a maximum number of volume levels setable by the user in the sound output system.

7. The apparatus of claim 5, wherein values of the volume levels stored in the memory are random.

8. A volume control method of a sound output system, the method comprising:

comparing, if a user selects another volume level, a number of volume levels selected by the user with a maximum number of volume levels setable by the user in the sound output system;

storing, if the number of volume levels selected by the user is smaller than the maximum number of volume levels, the volume levels selected by the user; and increasing the number of volume levels selected by the user by one, wherein if a sound increase/decrease interval information is input, the sound increase/decrease information is stored in a memory when a sound increase/decrease interval is greater than a predetermined minimum increase/decrease interval and less than a predetermined maximum increase/decrease interval.

9. The method of claim 8, further comprising controlling a volume level of sound output from the sound output system on a basis of an order in which volume levels selected by the user are stored, when the user inputs a volume control signal.

10. The method of claim 8, wherein the volume level selected by the user corresponds to a sound level that the user wants, between a minimum sound level and a maximum sound level that may be output from the sound output system regardless of a previously selected volume level.

11. A volume control apparatus of a sound output system, the apparatus comprising:

a sound control unit, to store sound increase/decrease interval information input from a user, and to control a sound output unit such that sound output from the sound output unit is increased/decreased on a basis of the sound increase/decrease interval information stored; and a sound output unit that outputs sound generated in the sound output system to an outside of the sound output system in accordance with the sound increase/decrease interval information, wherein the sound control unit comprises:

a memory in which the sound increase/decrease interval information that the user inputs is stored;

a command and information input unit that inputs the sound increase/decrease interval information and a volume control signal with respect to sound output from the sound output system; and a system control unit that stores, in the memory, the sound increase/decrease interval information input from the command and information input unit and controls the sound output unit such that sound output from the sound output unit is increased/decreased on a basis of the sound increase/decrease interval information stored in the memory when the volume control signal is received, and wherein if the sound increase/decrease interval information is input from the command and information input unit, the system control unit stores the sound increase/decrease interval information in the memory when the sound increase/decrease interval is greater than a minimum increase/decrease interval set in the sound output system and less than a maximum increase/decrease interval set in the sound output system.

12. The apparatus of claim 11, wherein the sound increase/decrease interval information is applied to a selected interval of sound that output from the sound output system.

13. A volume control method of a sound output system, the method comprising:
storing sound increase/decrease interval information input from a user; and
controlling a sound output unit such that sound output from the sound output unit is increased/decreased on a basis of the sound increase/decrease interval information stored,
wherein the storing of the sound increase/decrease interval information input from the user comprises:
comparing the sound increase/decrease interval information with a minimum increase/decrease interval set in the sound output system and a maximum increase/decrease interval set in the sound output system, and
if the sound increase/decrease interval information is greater than the minimum increase/decrease interval set in the sound output system and less than the maximum increase/decrease interval set in the sound output system, storing the input sound increase/decrease interval information in a memory.

14. The method of claim 13, wherein the controlling of the sound output unit such that sound output from the sound output unit is increased/decreased on a basis of the sound increase/decrease interval information stored comprises:
inputting, by the user, the sound increase/decrease interval information;
inputting a volume control signal with respect to sound output from the sound output system; and
using the stored sound increase/decrease interval information to control sound output from the sound output unit.

15. The method of claim 14, wherein the using of the stored sound increase/decrease interval information to control sound output from the sound output unit comprises:
applying the sound increase/decrease interval information to a selected interval of sound that is output from the sound output system.

16. A volume control apparatus of a sound output system, the apparatus comprising:
a sound control unit that stores volume levels selected by a user sequentially in an order selected by the user, and, upon inputting a volume control signal with respect to sound output, controls the sound output from the sound output unit on a basis of the volume levels stored sequentially; and
a sound output unit that outputs sound generated in the sound output system to an outside of the sound output system;
wherein the sound control unit comprises:
a memory in which the volume levels selected by the user are sequentially stored;
a command and information input unit that inputs the volume levels selected by the user and the volume control signal with respect to sound output from the sound output system; and
a system control unit that sequentially stores the volume levels input from the command and information input unit in the memory and controls the sound output unit such that sound output from the sound output unit is increased/decreased on a basis of the order of the volume levels stored in the memory when the volume control signal is input,
wherein when a sound increase/decrease interval information is input from the command and information input unit, the system control unit stores the sound increase/decrease interval information in the memory when the sound increase/decrease interval is greater than a minimum increase/decrease interval set in the sound output system and less than a maximum increase/decrease interval set in the sound output system.

17. The apparatus of claim 16, wherein a number of the volume levels storable in the memory is less than a maximum number of volume levels setable by the user in the sound output system.

18. The apparatus of claim 16, wherein values of the volume levels stored in the memory are random.

19. A volume control method of a sound output system, the method comprising:
setting, by a user, a maximum number of volume levels and increase/decrease intervals to enable a volume of sound output from the sound output system to be adjusted in units of an increase/decrease interval set by the user; and
storing each volume level and increase/decrease interval selected by the user until the maximum number of volume levels is obtained, wherein if a sound increase/decrease interval information is input, the sound increase/decrease information is stored in a memory when a sound increase/decrease interval is greater than a predetermined minimum increase/decrease interval and less than a predetermined maximum increase/decrease interval.

20. The method of claim 19, further comprising controlling a volume level of sound output from the sound output system on a basis of an order in which volume levels selected by the user are stored.

21. The method of claim 19, further comprising limiting the volume levels selectable by the user to a sound level between a minimum sound level and a maximum sound level that is output from the sound output system.

22. The method of claim 21, wherein the volume levels selectable by the user are independent of a previously selected volume level.

* * * * *

UNITED STATES PATENT AND TRADEMARK OFFICE
CERTIFICATE OF CORRECTION

| | | |
|---|---|---|
| PATENT NO. | : 7,330,554 B2 | Page 1 of 1 |
| APPLICATION NO. | : 10/602002 | |
| DATED | : February 12, 2008 | |
| INVENTOR(S) | : Hyun-sig Lim et al. | |

It is certified that error appears in the above-identified patent and that said Letters Patent is hereby corrected as shown below:

Title Page, Column 2 Item [57] (Abstract), Line 18, after "increased/decreased" insert --on--.

Column 9, Line 3, after "that" insert --is--.

Signed and Sealed this

Nineteenth Day of August, 2008

JON W. DUDAS
*Director of the United States Patent and Trademark Office*